(12) United States Patent
Tihanyi

(10) Patent No.: US 6,274,904 B1
(45) Date of Patent: Aug. 14, 2001

(54) EDGE STRUCTURE AND DRIFT REGION FOR A SEMICONDUCTOR COMPONENT AND PRODUCTION METHOD

(75) Inventor: Jenoe Tihanyi, Kirchheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/387,388

(22) Filed: Sep. 2, 1999

(30) Foreign Application Priority Data

Sep. 2, 1998 (DE) .............................. 198 39 970

(51) Int. Cl.$^7$ ............................................. H01L 29/76
(52) U.S. Cl. ..................... 257/329; 257/256; 257/279; 257/363; 257/328
(58) Field of Search ................................. 257/256, 263, 257/279, 328, 329

(56) References Cited

U.S. PATENT DOCUMENTS

| 4,370,180 | * | 1/1983 | Azuma et al. | 148/187 |
| 5,164,325 | * | 11/1992 | Cogan et al. | 437/29 |
| 6,037,631 | * | 3/2000 | Deboy et al. | 257/339 |

* cited by examiner

*Primary Examiner*—Olik Chaudhuri
*Assistant Examiner*—Wai-Sing Louie
(74) *Attorney, Agent, or Firm*—Herbert L. Lerner; Laurence A. Greenberg; Werner H. Stemer

(57) ABSTRACT

The invention relates to an edge structure and a drift region for a semiconductor component. A semiconductor body of the one conductivity type has an edge area with a plurality of regions of the other conductivity type embedded in at least two mutually different planes. Underneath an active zone of the semiconductor component the regions are connected over different planes via connection zone, but the regions are otherwise floating.

9 Claims, 3 Drawing Sheets

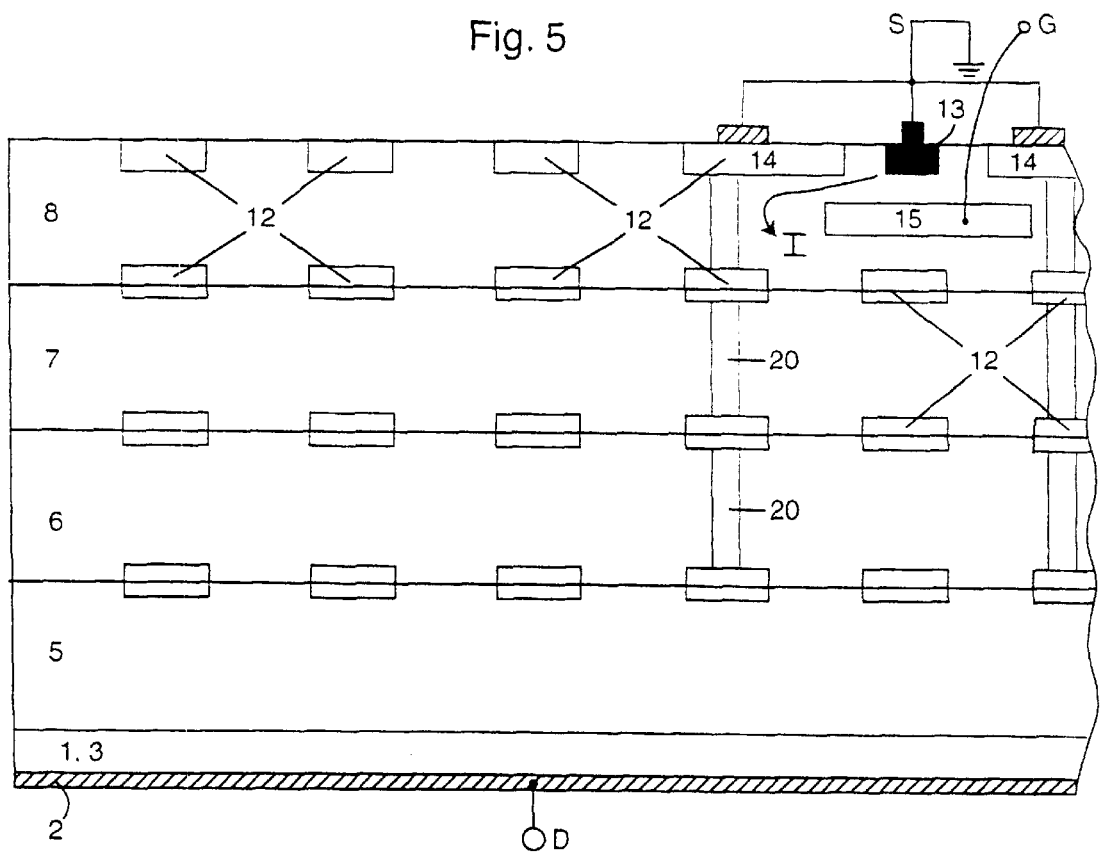

EDGE STRUCTURE AND DRIFT REGION FOR A SEMICONDUCTOR COMPONENT AND PRODUCTION METHOD

BACKGROUND OF THE INVENTION

Field of the Invention

The invention lies in the semiconductor technology field. More specifically, the present invention relates to an edge structure and a drift region ("internal structure") for a semiconductor component, having a semiconductor body of the one conductivity type, in which at least one active zone of the other conductivity type (opposite to the first conductivity type) is provided.

It is a well known fact that relatively high blocking voltages can be obtained in transistors with a relatively highly doped drift path. Examples of this are junction/trench MOS field effect transistors and transistors with a semiconductor body of the one conductivity type which is provided with floating regions of the other conductivity type.

Junction/trench MOS field effect transistors, such as "CoolMOS" transistors can be fabricated with a plurality of epitaxial depositions of n-type conductive semiconductor layers and implantations of p-type conductive dopant with subsequent diffusion so that p-type conductive "columns" are produced in the n-type conductive semiconductor layers. Here, the entire quantity of dopant of the p-type conductive columns should correspond approximately to the entire quantity of dopant of the n-type conductive semiconductor layers.

SUMMARY OF THE INVENTION

It is accordingly an object of the invention to provide a an edge structure and a drift region for a semiconductor component, which overcomes the above-mentioned disadvantages of the heretofore-known devices and methods of this general type and which does not require that the entire quantity of the doping of the two conductivity types in the component be precisely the same and the component is distinguished by a high degree of immunity to avalanching. In addition, it is an object to provide a method for fabricating such an edge structure and such a drift region for a semiconductor component.

With the foregoing and other objects in view there is provided, in accordance with the invention, an edge structure and drift region of a semiconductor component, comprising:

a semiconductor body of a first conductivity type formed of a plurality of planes;

an active zone of a second conductivity type opposite the first conductivity type disposed in the semiconductor body;

a plurality of regions of the second conductivity type embedded in at least two mutually different planes in the semiconductor body; and connection zones formed in an area substantially underneath the active zone, connecting the regions to one another across different the planes, whereby the regions are otherwise floating regions.

In other words, the objects of the invention are satisfied in that at least two mutually different planes in the semiconductor body have embedded in them a plurality of regions of the other conductivity type. In the area essentially underneath the active zone the regions are connected to one another by means of connection zones over different planes, but otherwise they float.

If the one conductivity type is n-type doping with, for example, phosphorus, and the other conductivity type is p-type doping with, for example, boron, in the edge structure according to the invention, or the drift region according to the invention, the quantity of p-type dopant in the edge region may be greater than the quantity of n-type dopant since it is not disadvantageous if some or all of the floating p-type regions are not completely emptied under off-state conditions. The floating regions also permit uniform reduction of the field strength in the edge region, which can be easily proven with two-dimensional simulation.

In accordance with an added feature of the invention, an insulation layer is formed on the semiconductor body and field plates are disposed in the insulation layer. Each of the field plates is electrically connected to the regions of an uppermost plane of the semiconductor body.

In accordance with an additional feature of the invention, protective rings of the second conductivity type are formed in a surface region of the semiconductor body and connected to the field plates.

In accordance with another feature of the invention, in an edge region, a quantity of dopant of the second conductivity type is higher than a quantity of dopant of the first conductivity type.

The connection zones are preferably more weakly doped than the regions themselves which are connected to one another underneath the active zone of the semiconductor component by means of these connection zones.

In accordance with a further feature of the invention, the semiconductor body is formed of silicon or of silicon carbide. Composite semiconductors are also possible.

With the above and other objects in view there is also provided, in accordance with the invention, a method of fabricating the above-summarized configuration, i.e., an edge structure and a drift region of a semiconductor component with a semiconductor body of a first conductivity type and an active zone of a second conductivity type opposite the first conductivity type disposed in the semiconductor body. The method comprises the following steps:

epitaxially forming successive individual semiconductor layers on a semiconductor substrate of the first conductivity type;

following the formation of each individual layer, introducing dopant of the second conductivity type into each respective epitaxial layer in a region underneath the active zone and introducing dopant of the second conductivity type in the rest of the edge region into at least every other epitaxial layer (or each third or fourth epitaxial layer). The dopant is preferably introduced by ion implantation and/or by diffusion.

In accordance with an alternative mode of the invention, the invention comprises the following steps:

successively forming individual semiconductor layers of the first conductivity type by epitaxy on a semiconductor substrate; and following the formation of each semiconductor layer, forming a V-shaped trench in a region underneath the active zone with a highly doped base, highly doped collar regions, and weakly doped side walls.

In accordance with a concomitant feature of the invention, doping is effected by ion implantation at an oblique angle.

After the implantation has been carried out, a further epitaxial layer is deposited, the trench thus being filled. This procedure is repeated several times until the desired electrical connection zones in the individual epitaxial layers between the regions of the other conductivity type are produced. After a possible diffusion, the regions of the other conductivity type and the weakly doped conduction zones between these regions underneath the active zone of the semiconductor component finally flow apart so that a structure is produced in which highly doped regions of the other conductivity type in different planes are connected to one another by means of weakly doped connection zones of the other conductivity type underneath the active zone of the semiconductor component, while in the edge region outside the region underneath the active zone the areas of the other conductivity type float and are not connected to one another by means of conduction zones in different planes.

In accordance with yet another feature of the invention, service life killer atoms are introduced in the regions, for instance in the trenches, making it possible, for example, to obtain small storage charges for diodes.

The semiconductor component may be a junction/trench MOS field effect transistor, a diode, an IGBT (bipolar transistor with insulated gate), a SiC junction field effect transistor etc.

Other features which are considered as characteristic for the invention are set forth in the appended claims.

Although the invention is illustrated and described herein as embodied in an edge structure and drift region for a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a section through an edge structure and a drift region according to an exemplary embodiment of the invention for a silicon carbide junction MOS field effect transistor. Mutually corresponding components are identified with the same reference symbols throughout the figures.

DESCRIPTION OF THE PREFERRED EMBODIMENTS

Figure 1:
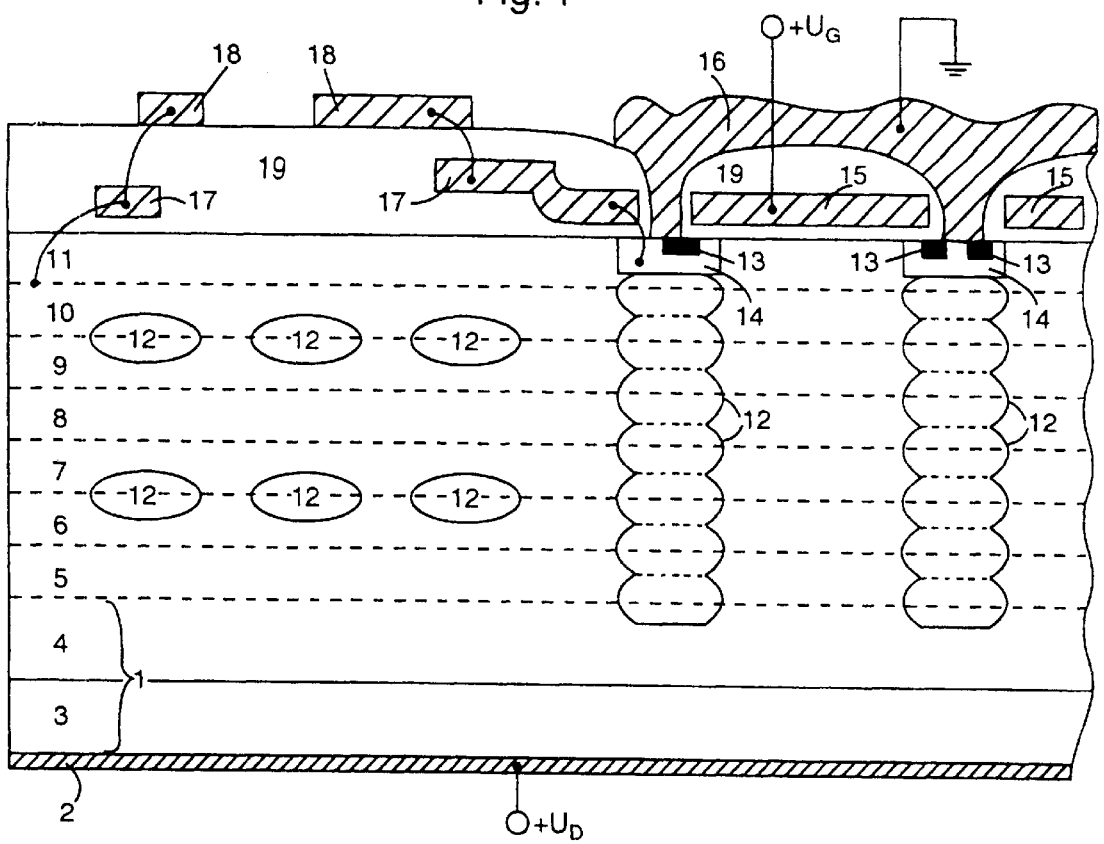
FIG. 1 is a section through an edge structure and a drift region according to a first exemplary embodiment of the invention for a MOS field effect transistor.

Referring now to the figures of the drawing in detail and first, particularly, to FIG. 1 thereof, there is seen a silicon semiconductor substrate 1 composed of an n$^+$-type conductive semiconductor region 3 and an n-type conductive semiconductor region 4 and with a drain electrode 2 made of metal, such as aluminum, for example, to which a draining voltage +$U_D$ is applied. On the semiconductor substrate 1 there are various epitaxial layers 5, 6, 7, 8, 9, 10, 11, into which p-type conductive semiconductor regions 12 are embedded. In the drift region underneath the n$^+$-type conductive source zones 13 and p-type conductive channel zones 14, the p-type conductive regions 12 are vertically connected, whereas they are of floating design outside these regions.

For this purpose, the procedure adopted during the epitaxial deposition of the individual layers 5 to 11 is such that underneath the active zones 13, 14 there is an ion implantation with p-type conductive dopant, for example boron, in each layer surface of the individual layers 5 to 11, whereas in the edge region such an implantation is carried out only in every fourth layer, for example.

In the edge region, the entire quantity of the p-type conductive dopant may by greater than the entire quantity of the n-type conductive dopant since it is not disadvantageous if some or all of the p-type conductive "island"-like floating regions 12 are not completely emptied under off-state conditions.

The floating p-type conductive regions 12 permit, in the edge region, a uniform reduction of the field strength so that the immunity to avalanching is considerably increased.

As is shown in FIG. 1, in this MOS field effect transistor, gate electrodes 15 to which a gate voltage +$U_G$ is applied, source contacts 16, which are connected to ground, field plates 17, which are connected to the zone 14 or to the epitaxial layer 11 and to aluminum electrodes 18 are also provided in or on an insulation layer 19 made of silicon dioxide, for example. The electrodes 15 and the magneto-resistors 17 may be composed, for example, of doped polycrystalline silicon.

Figure 2:
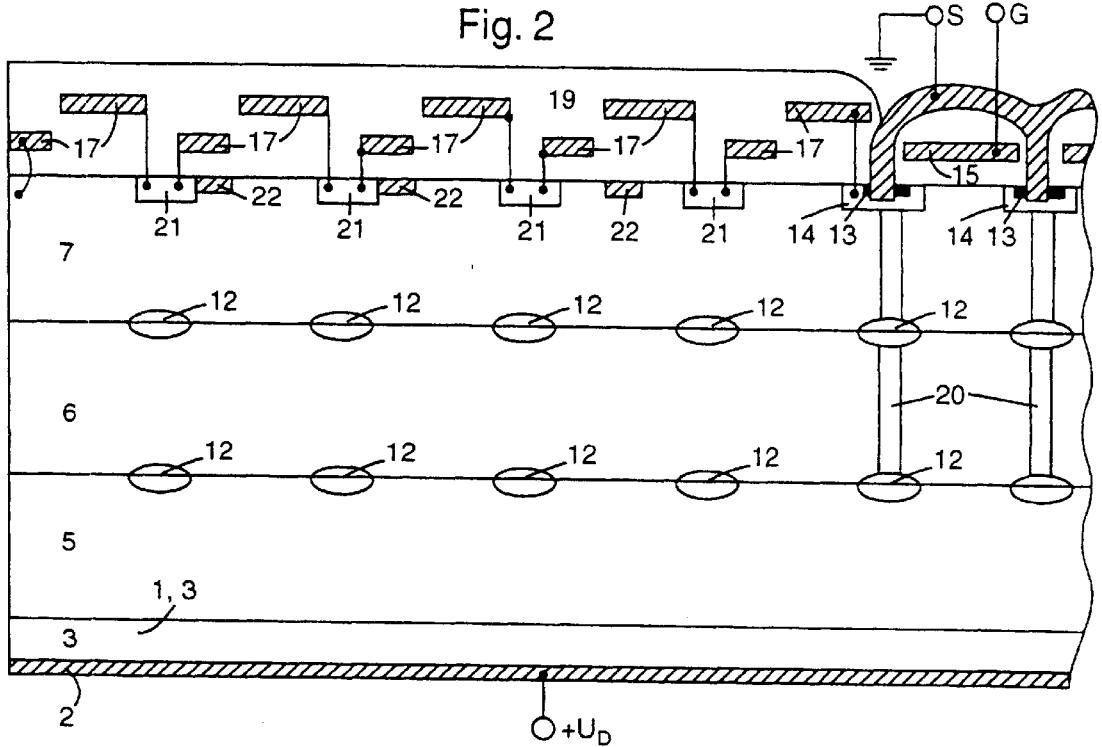
FIG. 2 is a section through an edge structure and a drift region according to a second exemplary embodiment of the invention for a high-voltage MOS field effect transistor.

FIG. 2 shows a further exemplary embodiment of the edge structure according to the invention for a high-voltage MOS field effect transistor. In this second exemplary embodiment the p-type conductive regions 12 are vertically connected to one another in the region underneath the active zones 13, 14 by means of p$^-$-type conductive connection zones 20, and they thus each form gates. In addition, in this exemplary embodiment there are also p-type conductive protective rings 21 and n-type conductive surface zones 22 which are introduced by ion implantation. The protective rings 21 are each connected here to associated field plates 17. A possible fabrication method for the structure in FIG. 2 is explained in more detail below with reference to FIG. 4.

Figure 3:
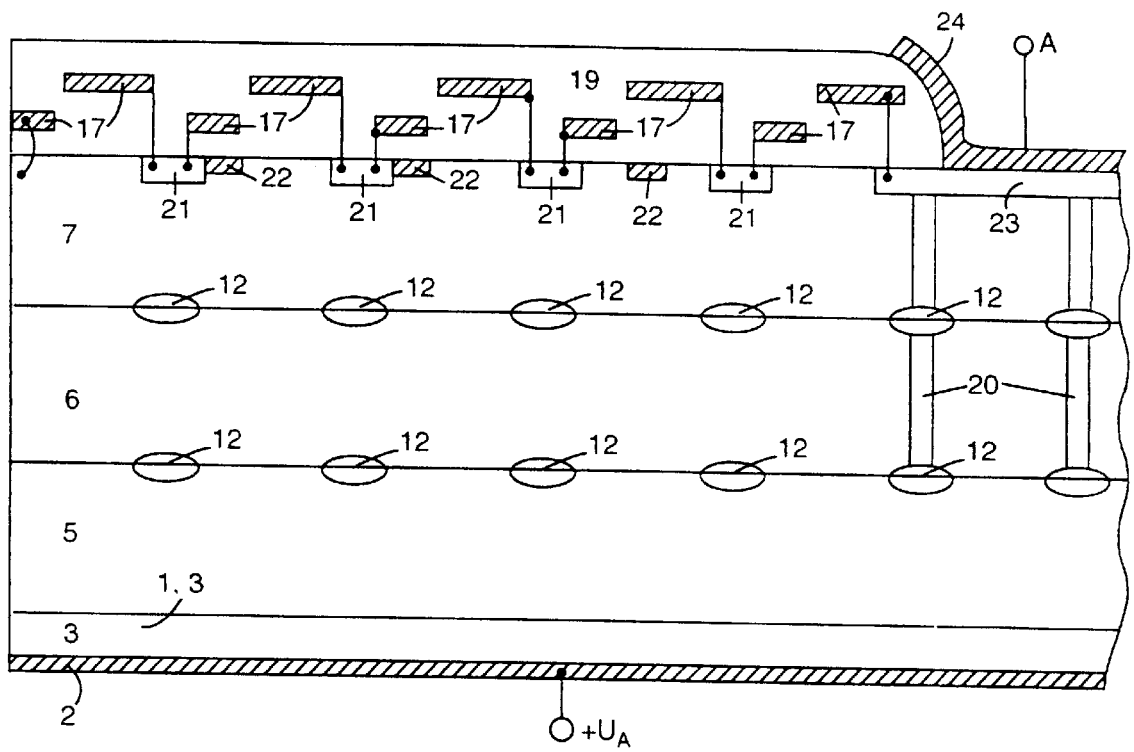
FIG. 3 is a section through an edge structure and a drift region according to a third exemplary embodiment of the invention for a high voltage diode.

FIG. 3 shows, as a further exemplary embodiment of the invention, an edge structure and a drift region for a high voltage diode, a voltage +$U_A$ being applied here to the electrode 2 and a p-type conductive zone 23 with an anode contact 24 for an anode A being provided instead of the active zones 13, 14. Otherwise, this exemplary embodiment corresponds to the edge structure and the drift region in FIG. 2.

Figure 4:
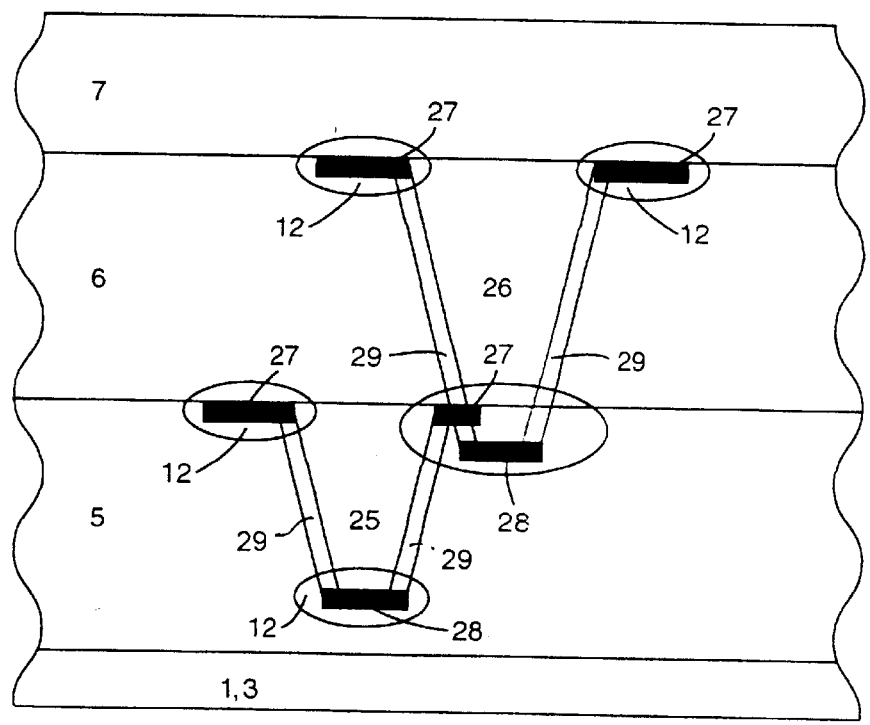
FIG. 4 is a section through a drift region explaining the fabrication method according to the invention.

From FIG. 4 it is clear how the drift regions of the exemplary embodiments of FIGS. 2 and 3 can be fabricated: a trench 25 or 26 is etched into each of the approximately 10 to 50 μm thick epitaxial layers 5 and 6, in each case after the deposition of the layer 5 or 6. The trench is then implanted with acceptors in such a way that the collar and base regions 27 and 28 are highly doped with the acceptor, for example boron, while the side wall regions 29 are only weakly doped with boron. For this purpose, implantation at an oblique angle may be used and/or the trench 25 or 26 may be V-shaped, as shown in FIG. 4. After the implantation, for example in the trench 25, the second epitaxial layer 6 is deposited, and the trench 25 is filled with the n-type conductive material. As a result of a subsequent diffusion, the regions 12, which are connected to one another by means of the side wall regions 29 as weakly doped connection zones 20, are then formed from these collar or base regions 27 or 28. In their collar region the trenches 25, 26 have a width of approximately 1 to 2 µm. However, all values are of course possible.

Silicon or silicon carbide can be used for the semiconductor body. An exemplary embodiment of the edge structure and of the drift region which is suitable specifically for silicon carbide as a semiconductor body is shown in FIG. 5. In this exemplary embodiment, the source contact S is connected to the $n^+$-type conductive zone 13 and to the $p^+$-type conductive zone 14, while a $p^+$-type conductive gate electrode 15 is embedded in the epitaxial layer 8. In this exemplary embodiment also, the p-type conductive regions 12 are connected to one another underneath the active zones 14 by means of weakly doped $p^-$-type conductive connection zones 20.

I claim:

1. An edge structure and drift region of a semiconductor component, comprising:
   a semiconductor body of a first conductivity type formed of a plurality of planes;
   an active zone of a second conductivity type opposite the first conductivity type disposed in said semiconductor body;
   a plurality of regions of the second conductivity type embedded in at least two mutually different planes in said semiconductor body; and
   connection zones formed in an area substantially underneath said active zone, connecting said regions to one another across different said planes, whereby said regions are otherwise floating regions.

2. The edge structure and drift region according to claim 1, which further comprises an insulation layer formed on said semiconductor body and field plates disposed in said insulation layer and each electrically connected to said regions of an uppermost plane of said semiconductor body.

3. The edge structure and drift region according to claim 2, which further comprises protective rings of the second conductivity type formed in a surface region of said semiconductor body and connected to said field plates.

4. The edge structure and drift region according to claim 1, which further comprises protective rings of the second conductivity type formed in a surface region of said semiconductor body and field plates connected to said protective rings.

5. The edge structure and drift region according to claim 1, wherein, in an edge region, a quantity of dopant of the second conductivity type is higher than a quantity of dopant of the first conductivity type.

6. The edge structure and drift region according to claim 1, wherein said connection zones are more weakly doped than said regions.

7. The edge structure and drift region according to claim 1, wherein said semiconductor body is formed of silicon.

8. The edge structure and drift region according to claim 1, wherein said semiconductor body is formed of silicon carbide.

9. The edge structure and drift region according to claim 1, which further comprises service life killer atoms introduced in said regions.

* * * * *